United States Patent [19]

Martin et al.

[11] Patent Number: 4,579,080

[45] Date of Patent: Apr. 1, 1986

[54] INDUCTION HEATED REACTOR SYSTEM FOR CHEMICAL VAPOR DEPOSITION

[75] Inventors: John G. Martin, San Jose; Walter C. Benzing; Robert Graham, both of Saratoga, all of Calif.

[73] Assignee: Applied Materials, Inc., Santa Clara, Calif.

[21] Appl. No.: 698,580

[22] Filed: Feb. 6, 1985

Related U.S. Application Data

[63] Continuation-in-part of Ser. No. 560,085, Dec. 9, 1983, abandoned.

[51] Int. Cl.[4] .................. C23C 16/00; H05B 5/00; H05B 6/64
[52] U.S. Cl. ............................ 118/500; 118/724; 118/725; 118/729; 118/730; 219/10.49 R; 219/10.67; 219/10.75
[58] Field of Search ............... 118/500, 724, 725, 729, 118/730; 219/10.67, 10.99 R, 10.49 R, 10.75

[56] References Cited

U.S. PATENT DOCUMENTS

3,665,139  5/1972  Steggewentz .................. 219/10.43
4,258,658  3/1981  Politycki et al. .................. 118/719
4,284,867  8/1981  Hill et al. .................. 219/10.49 R Primary Examiner—Michael R. Lusignan
Attorney, Agent, or Firm—Flehr, Hohbach, Test, Albritton & Herbert

[57] ABSTRACT

A chemical vapor deposition system which includes a generally closed reaction chamber having walls formed from a dielectric material. A susceptor for carrying a plurality of semiconductor wafers is positioned within the chamber. An induction coil is positioned in the vicinity of the susceptor for carrying an alternating electric current to produce induction heating of the susceptor and thereby heating the back side of the wafers thereon. Low frequency induction heating and variations in susceptor thickness are used to produce uniformity of temperature. Boundary control arrangement between the susceptor surface and wafer surfaces are used to improve deposition uniformity. A coating is formed on wall portions of the reaction chamber facing the susceptor and wafers carried thereon for reflecting heat energy radiated from the susceptor and the wafers positioned thereon back to the susceptor and the wafers to reduce substantially the heat loss therefrom and thereby to reduce substantially the thermal gradient from front to back surfaces of the wafers.

21 Claims, 24 Drawing Figures

INDUCTION HEATED REACTOR SYSTEM FOR CHEMICAL VAPOR DEPOSITION

This application is a continuation-in-part of co-pending U.S. patent application Ser. No. 560,085, filed Dec. 9, 1983, now abandoned.

This invention relates generally to reactor systems for depositing layers of material on a semiconductor wafer substrate using chemical vapor deposition (CVD) principles and, more particularly, to reactor systems utilizing induction heating.

Very great improvements in the scale of integration of semiconductor device on integrated circuit (IC) chips and the speed of operation of such devices have been achieved over the past several years. These improvements have been made possible by a number of advances in integrated circuit manufacturing equipment as well as improvement in the materials and methods utilized in processing virgin semiconductor wafers into IC chips. The most dramatic advances in manufacturing equipment have been improved apparatus for lithography and etching which are at the heart of semiconductor processing. Generally the density of integrated circuits and their speed of operation are dependent largely upon the accuracy and resolution of the lithography and etching apparatus used to form patterns of circuit elements in masking layers on the semiconductor wafer.

Although accuracy and resolution of definition and etching in semiconductor processing is an important determining factor in the density of integrated circuit devices that can be produced on a wafer, an equally important aspect of semiconductor IC manufacture is high yield of good working IC devices formed on the semiconductor wafer.

In the mid-1970's the introduction of substantially dislocation free silicon wafer starting material offered the prospects of substantial yield improvements in IC processing. However, the improvements in the starting material created a challenge of maintaining the silicon wafers in their dislocation free state throughout the various steps of IC processing. Dislocations in the crystal lattice of the semiconductor wafer are well-known to be sinks (i.e. gathering places) for impurities which, in turn, may cause diode leakage and emitter-collector shorts in semiconductor devices. Such defects produce bad IC chips and lower wafer processing yields.

Thermal stress in a semiconductor wafer during processing can cause dislocations to nucleate at defect centers. These stress generated dislocations move in large numbers along favored crystallographic planes and directions. This movement leaves visible slip lines where one part of the crystal surface is displaced from another by a vertical step. The visibility of these slip lines can be enhanced by defect etching.

One of the high temperature processing steps utilized in a number of IC processes is the growth of an epitaxial silicon layer on a wafer substrate. Growth of an epitaxial silicon layer is typically performed in a chemical vapor deposition process in which the wafers are heated while a gaseous silicon compound is passed over the wafer. Epitaxial silicon wafers are important to bipolar IC processing since many of the components of the individual bipolar transistors are formed in an epitaxial layer. The yield of good bipolar IC chips in a bipolar process is strongly dependent on maintaining a substantially dislocation free state for the semiconductor wafer during the step of depositing the epitaxial silicon layer and during any high temperature processing steps carried out before and after growing the epitaxial layer.

Figure 1:
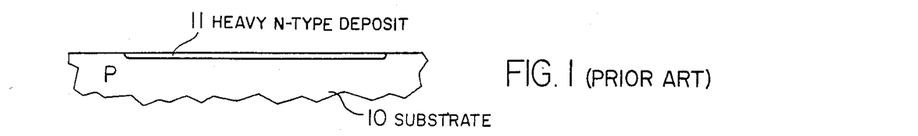
FIGS. 1–3 are fragmented section views through a portion of a semiconductor wafer showing the use of epitaxial silicon layers on wafers in bipolar semiconductor processing.
Figure 2:
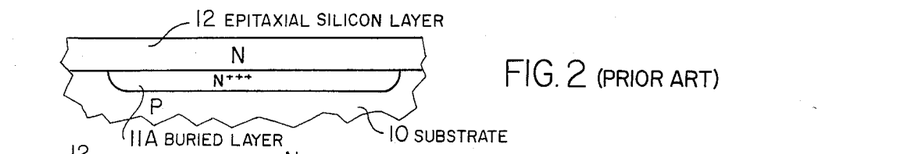
Figure 3:
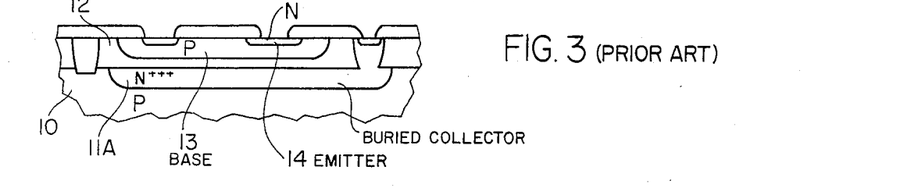

FIGS. 1-3 illustrate the use of an epitaxial silicon layer in bipolar IC processing. Only a very small area of the substrate occupied by a single transistor device is shown in these figures. Each IC chip on a wafer may have several thousand transistors and each wafer may have dozens of IC chips. As shown in FIG. 1, an early step in bipolar device processing is to make a heavy deposit of an N-type dopant material in defined regions 11 on the surface of a P-type silicon substrate 10. The heavy N-type material is deposited in regions which will later become buried collector regions of an NPN transistor. As shown in FIG. 2, a later step in the process drives the heavy N-type material deeper into the substrate 10 to create the buried layer 11A. An epitaxial silicon layer 12 is then formed over the entire surface of the semiconductor wafer substrate. The epitaxial silicon layer is typically doped with an N-type dopant as it is being formed.

As shown in FIG. 3, the heavily doped buried layer 11A becomes the buried collector of the NPN transistor. A P-doped region 13 in the epitaxial layer 12 forms the base of the NPN transistor. An N-doped region 14 within the base region 13 becomes the emitter of the NPN transistor. Stress induced slip in the crystal lattice in the region of such a transistor is likely to make the transistor defective in its operation. Defective transistors lead to defective circuits on individual IC chips, and defective chips on the wafer reduce the yield of good IC devices in the semiconductor processing operation.

Other important yield related factors in the process step of depositing the epitaxial silicon layer are thickness uniformity of the epitaxial layer and uniformity of dopant concentration. As the diameter of semiconductor wafers has increased and the requirement for processing more wafers per batch has accelerated, it has become increasingly difficult to maintain sufficient control over uniformity of these parameters. For example, if between twenty and thirty wafers per batch are being processed, it is not only critical to maintain uniformity of these parameters across the area of each wafer but also from wafer to wafer in each batch. Increased sophistication and density of IC devices has produced a tightening of uniformity specifications which the CVD process equipment must satisfy.

Figure 4:
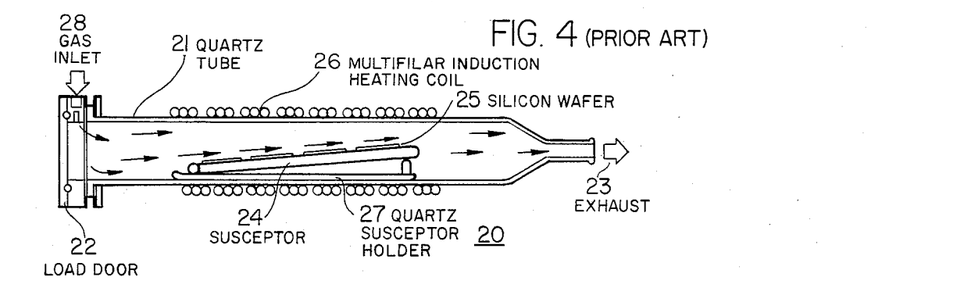
FIG. 4 is a schematic diagram of a horizontal slab CVD reactor system in accordance with the prior art.
Figures 5, 6:
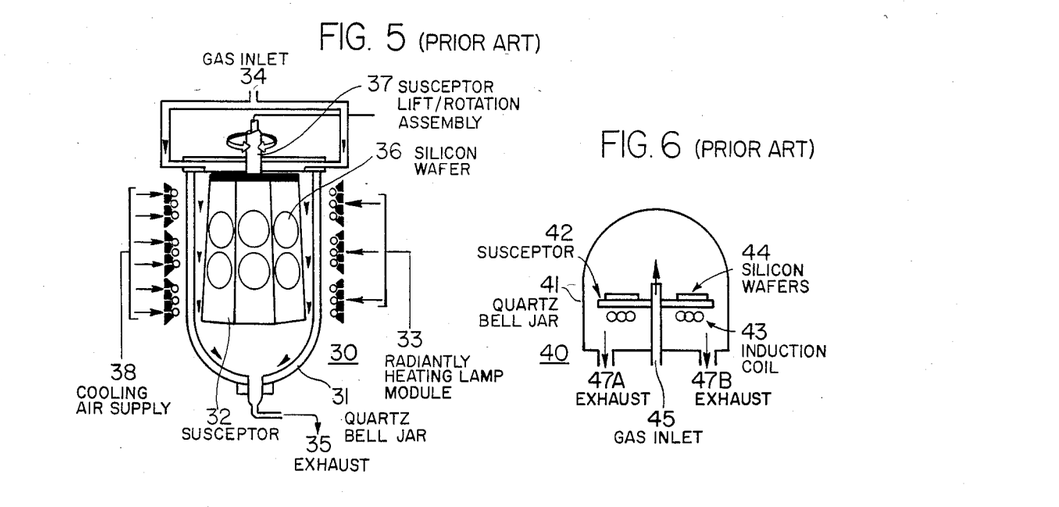
FIG. 5 is a schematic diagram of a radiantly heated cylindrical reactor system in accordance with the prior art.
FIG. 6 is a schematic diagram of a vertical pancake reactor system in accordance with the prior art.

In most reactors used for the growth of epitaxial silicon, the wafers are heated in one of two ways: indirect heating from an inductively heated susceptor and direct heating in a radiant heating mode by infrared and visible radiation from a bank of tungsten-halogen lamps. FIGS. 4 and 6 show typical prior art induction heated horizontal and vertical reactors. FIG. 5 shows a radiant heated reactor of the type which has become the commercial system of choice for high temperature CVD processing because the more uniform heating of the wafers produces more slip free wafers at the end of the epitaxial growth process in the reactor.

The induction heated horizontal reactor system 20 shown in FIG. 4 utilizes a quartz tube 21 having a load door 22 on one end with a gas inlet 28 therein and an exhaust port 23 at the other end. Silicon wafers 25 are supported on a susceptor 24 which is held at an angle by a quartz susceptor holder 27 and induction heating coil 26 causes heating of the susceptor wafer carrier 24 which in turn heats the silicon wafers 25 by a combination of conduction and radiation. However, in this system only the back side of the silicon wafers 25 is heated and the front surfaces of the wafers face a cold wall of the quartz tube to which they in turn radiate. During high temperature processing in the 1,000° to 1,200° C. range, this back side only heating of the semiconductor wafers may cause a substantial thermal gradient from front to back surfaces of the individual wafers. As the hotter side of the wafer expands more than the cooler side, this results in a bowing or curvature of the wafer. This bowing of the wafer moves the edges of the wafer further from the susceptor and produces greater heating in central regions of the wafer than at the edges. The resultant radial temperature gradient causes the stress induced defects discussed above. U.S. Pat. No. 3,665,139 shows the use of a reflecting layer to reflect heat back to the wafers on the susceptor. This would tend to reduce the thermal stress in the wafers.

The same type of induction heating is performed in the vertical pancake reactor system 40 shown in FIG. 6. In this system a quartz bell jar 41 houses a susceptor 42 on which the silicon wafers 44 are mounted. The susceptor 42 is heated by induction coil 43 which in turn heats the silicon wafers 44. Gaseous products used to form the epitaxial silicon layer and to dope the layer are introduced through gas inlet 45. The reaction products are exhausted from the interior of bell jar 41 through exhaust ports 47A and 47B. In this system, the same back side heating of the silicon wafers produces the same tendency to generate thermal stresses in the wafers which, in turn, produce stress induced defects due to the slippage in the planes of the crystal lattice structure.

The radiant heating reactor system 30 illustrates schematically a reactor system commercially available from Applied Materials Corporation of Santa Clara, Calif. In this system an inverted quartz bell jar 31 houses a generally cylindrical susceptor 32 on which silicon wafers 36 are mounted. Modular banks 33 of tungsten-halogen cycle lamps surround the exterior of the quartz bell jar 31 and radiantly heat both the susceptor 32 and the wafers 36 mounted thereon. Gases for forming and doping the epitaxial silicon layer are provided to the interior of the bell jar 31 through gas inlet 34. A susceptor lift/rotation assembly 37 rotates the susceptor 32 within the bell jar for uniform deposition of the epitaxial layer. It also elevates the susceptor for loading and unloading wafers. Reaction products are exhausted through port 35 at the bottom of the bell jar.

A cooling air supply 38 is provided both for the lamp modules 33 (to increase the lifetime of the lamps) and also for the exterior walls of the quartz bell jar 31. Cooling of the quartz bell jar 31 is preferable to minimize the formation of silicon deposits on the interior surface thereof. Such deposits can later cause a contamination problem if portions flake off and become incorporated into the epitaxial layer being formed on the individual wafers.

The radiantly heated reactor system 30 shown schematically in FIG. 5 has been a workhorse in the semiconductor industry for many years. In this system the simultaneous radiant heating of both the susceptor and the wafer produces uniform heating of the wafer and slip free performance of silicon epitaxy. However, there are certain drawbacks to the system. The air cooling of the chamber walls is inadequate under some process conditions to eliminate deposits on the interior walls of the chamber. Liquid cooling of the chamber walls would be preferred because of the higher coefficient of heat transfer to a liquid coolant. Air cooling cannot be replaced with liquid cooling techniques in the radiant heated system because the high energy absorbancy of liquids at the wavelength of the radiation emitted from the tungsten-halogen lamps would drastically reduce energy coupling into the chamber to heat the susceptor and wafers. The tungsten lamps are relatively inefficient converters of energy into radiation and thus high energy consumption is required in the radiant heating system. The limited life of tungsten-halogen lamps requires frequent maintenance and replacement. In addition, if a substantial number of lamps burn out during a production cycle, the thermal performance of the reactor may be sufficiently affected to degrade the quality of the epitaxial silicon layers produced on some wafers in the system. This may produce yield fall off.

It has also been found difficult to control the degree of heat produced by the lamp modules by altering the amount of electric energy supplied to the individual modules. The lamp modules require complex power supply and control circuitry; thus the overall energy, maintenance, and initial capital expense burden of the system is relatively high. In addition, as the semiconductor industry has shifted production to use of larger and larger diameter wafers and as wafer throughput demand of the industry has increased, the problems of scaling up the size of the radiant heated reactor system have become more acute and apparent.

Accordingly, it is the principal object of this invention to provide an induction heated reactor system with improved wafer heating characteristics.

It is another object of this invention to provide an induction heated reactor system which produces high quality epitaxial silicon layers without substantial slip in the crystal lattice structure at high temperatures required in semiconductor processing.

This invention features a chemical vapor deposition system which combines a generally closed reaction chamber having walls formed from a dielectric material with a susceptor for holding a plurality of semiconductor wafers adapted to be positioned within the chamber and formed from an electrically conductive material adapted to be heated by induction. The system further includes an induction coil surrounding at least a portion of the chamber which confines the susceptor for carrying an alternating electric current to produce induction heating of the susceptor and thereby heating the back side of the wafers mounted on the susceptor. A current supply arrangement supplies the induction coil with alternating electric current at a prearranged frequency to induce heating currents throughout a region of the susceptor having a skin depth related to the prearranged frequency. The susceptor is formed to have a general thickness less than or equal to the skin depth of the induced heating currents, but the susceptor is also formed to have regions of substantially reduced thickness at prearranged locations relative to wafer positions on the susceptor to induce greater induced heating at such prearranged locations and thereby to alter the temperature of the susceptor at such regions. These regions of substantially reduced thickness are positioned at locations on the susceptor which produce substantially uniform temperature profile across the susceptor at predefined wafer positions.

In addition, the system of this invention employs a reflector arrangement which faces the susceptor in the wafers carried thereon to reflect heat energy back to the susceptor and the wafers. This reduces a substantially the heat loss from the susceptor and wafers and thus reduces the thermal gradient from front to back surfaces of the wafers. The combination of the uniform temperature profile of the susceptor due to the reduced thickness regions and the reduced thermal gradient in the wafers due to the heat reflection arrangement provide substantially slip free heating conditions for the wafers and substantially uniform deposition rates on the wafers during a deposition process carried out in the system.

The improvements of this invention are preferably employed in a generally cylindrical reaction chamber disposed with its central axis in a vertical orientation similar to the cylindrical reactor of the prior art radiant heating type. A generally cylindrical susceptor with an arrangement of straight sidewall segments is provided with the sidewall segments including a regular array of wafer holding recesses formed on front surface regions thereof. Preferably, in accordance with this invention, the straight sidewall segments meet at corner regions and, at each of these corner regions, one of the regions of reduced wall thickness is provided. Top and bottom regions of the susceptor also have reduced wall thickness to produce greater induction heating of these regions. The power supply arrangement for supplying the induction coil with electrical current has a frequency preferably in the range of about five to fifteen kilohertz. This frequency for current in the induction coil induces corresponding heating currents in the susceptor throughout all or a substantial depth of the susceptor sidewalls which are preferably less than 0.5 inches thick at the maximum thickness regions.

The combination of this relatively deep induction current skin thickness and the reduced wall thickness at corner regions of the susceptor sidewall segments and top and bottom regions produces greater heating of these susceptor regions. The net result is a more uniform susceptor temperature distribution across the width of the sidewall segments and from top to bottom thereof. This in turn produces more uniform heating of the semiconductor wafers from center to edge and results in more uniform thickness and doping concentration in the epitaxial layer.

Another aspect of this invention features a chemical vapor deposition system of the vertical cylindrical reactor chamber type discussed above, including the induction heating system, and a hollow susceptor which has a truncated pyramid configuration. A gas delivery means is provided for delivering reactive gas to the reaction chamber in a region above the susceptor and for withdrawing reactive gases from the reactive chamber below the susceptor. Boundary control surfaces are carried on the susceptor on prearranged locations relative to the wafer carrying recesses to locally alter the boundary conditions between the reactant gases and the surfaces of the susceptor and the wafers carried thereon and thereby to provide more uniform deposition of material on the wafers.

The boundary control surfaces preferably include a surface arrangement which defines a wall surface region projecting radially outward from the susceptor at a position spaced above a top row of the wafer carrying recesses. This equalizes the relative deposition of material on the wafers in the top row with respect to wafers in lower rows of wafer carrying recesses on the susceptor. This surface arrangement may be provided by a top cap on the susceptor which is carried on the top edge and has a marginal edge region overhanging the adjacent front wall surfaces of the susceptor. Preferably this top cap includes a central portion defining a generally bowl shaped recess extending in to the hollow interior of the susceptor. The gas delivery means preferably includes a piping means for delivering the reactive gases directly into the bowl shaped means for preheating and mixing on the reactive gases prior to passing over the overhanging edge portions of the top plate.

The system of this invention preferably further includes an arrangement for rotating the susceptor in sequential opposite direction rotation cycles during an overall layer deposition cycle. The preferred embodiment further includes, as part of the boundary control arrangement, surface configurations which define contoured wall surface regions which overlap the side edges of each of the wafer carrying recesses to contour the displacement between the susceptor surface and the wafer surface at such locations. This produces more uniform deposition of material from side to side on each wafer carried in the wafer carrying recesses. These contoured wall surface regions are preferably contoured, outwardly projecting edge regions integrally formed on the susceptor at such regions.

The improved wafer heating performance of a CVD reactor system in accordance with this invention has the major benefit of enabling the induction heating approach to be applied to high temperature wafer processing without producing thermally induced dislocations and structural defects in the crystal lattice structure of the wafer. The boundary control feature of this invention together with improved uniformity of wafer heating enables deposition parameters such as thickness uniformity to be maintained within about one to five percent on each wafer and from wafer to wafer. The improvements contributed by this invention permit all of the convenience aspects of an induction heating system to be realized in a scaled-up version of a reactor system to handle relatively large numbers of large diameter semiconductor wafers.

The preferred embodiment of this invention employs liquid cooling of the reactor walls. Liquid cooling has an associated heat transfer coefficient of about 50 BTU/(hr. ft$^2$°F.) while the heat transfer coefficient for air cooling is 5. This more efficient liquid cooling enables cooler reactor wall temperatures to be maintained to eliminate inner wall deposits and associated contamination problems. The system also has the benefit of low maintenance induction heating, reducing the overall capital costs and operating costs for accomplishing silicon epitaxy. Other types of chemical vapor deposition processes can also be carried out in systems according to this invention.

Other objects, features and advantages will be apparent from a consideration of the following detailed description taken in conjunction with the accompanying drawings.

FIGS. 1-6 have been described above in connection with the prior art and further description of these drawing figures is unnecessary at this point.

Figure 7:
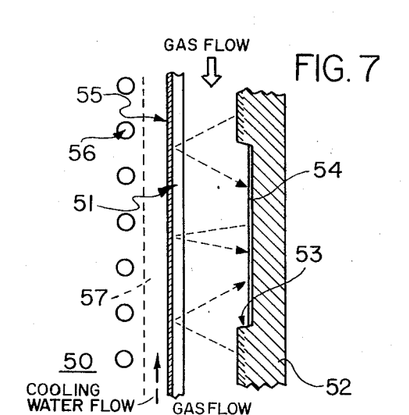
FIG. 7 is a schematic section diagram illustrating the structure and operation of a reactor system in accordance with one embodiment of this invention.
Figure 8:
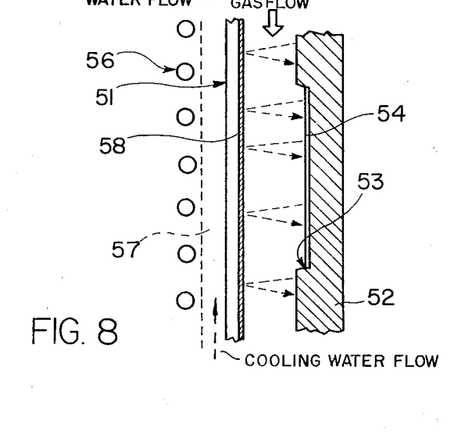
FIG. 8 is a schematic section diagram illustrating the structure and operation of an alternative embodiment of a reactor system in accordance with this invention.

FIGS. 7 and 8 illustrate the principles of this invention in a general schematic way in two alternative embodiments. Reference numeral 51 designates the wall of a reaction chamber which is formed from a dielectric material. Within the interior of the closed reaction chamber of which wall section 51 is a part is a susceptor 52 which is formed from an electrically conductive material which is adapted to be heated by induction and can withstand the reactor operating temperatures without deforming. The susceptor is preferably formed of graphite material coated with silicon carbide, but other materials such as molybdenum, silicon or glassy carbon may also be used. Susceptor 52 includes a recessed area 53 which holds a semiconductor wafer 54. In this embodiment the susceptor is positioned in a vertical orientation and the wafer holding recess 53 is necessary to support the wafer in the susceptor. If the principles of this invention were applied to a horizontal reactor it would not be necessary for the wafers to be positioned within a recess in the susceptor.

Susceptor 52 is heated by currents induced therein by currents in the induction coil 56. As susceptor 52 heats up it in turn heats the wafer 54 by a combination of direct conduction to the wafer at places where the wafer is in contact with the susceptor, conduction through the thin gas layer between the susceptor and the wafer, and radiation to the wafer from the susceptor.

FIG. 7 illustrates two features of this invention which have been discovered to be important factors in achieving satisfactory performance of an induction heated reactor system in view of the uniformity requirements placed on such systems by a semiconductor processing industry. One feature of this invention involves utilizing induction currents with a skin depth designated by the boundary line displacement 52C from the front surface of the susceptor. The use of an inductive current skin depth which is greater than or equal to the thickness of the susceptor enables direct control of the thermal energy production in local regions of the susceptor by controlling the thickness of the susceptor at various regions. For example region 52A is a region of substantially lesser thickness of the susceptor.

Because the induced heating currents in the susceptor are forced to traverse a thinner region with higher overall resistivity, a greater induction heating is produced in the susceptor at this reduced thickness region. This greater production of energy at such location can be utilized to compensate for higher heat transfer away from such a region and thereby control the temperature of that region to be more uniform with respect to other regions of the susceptor. These reduced thickness regions may be positioned selectively with respect to the wafer holding recess 53 in the susceptor. This energy and temperature control makes it possible to arrange the temperature distribution throughout the center to outer diameter of the wafer to be more constant. As previously explained, this is important to achieving uniformity in deposition of material on the wafer and uniform doping concentrations in that material.

FIG. 7 also illustrates that the distribution of the thickness of the material deposited on the wafer 54 can be controlled by utilizing boundary control means carried on the susceptor at prearranged locations relative to the wafer carrying recesses to locally alter the boundary conditions between the reactant gases and the surfaces of the susceptor and wafers carried thereon. As shown in FIG. 7A boundary control projection 52B is provided on the susceptor 52 at a location adjacent to and overlapping the edge of the wafer 54. Such a contoured projection on the susceptor may be integrally formed or, alternatively, could be provided by a separate element mounted to the susceptor. These boundary control arrangements provide effective control of deposition rate at the adjacent wafer surfaces. For example, it has been discovered that, in general, the displacement distance between the surface of the wafer and the adjacent front surface of the susceptor substantially affects the deposition rate at the associated edge regions of the semiconductor wafer. Thus, under circumstances where heavier deposition of material tends to occur on the edges of the wafer relative to the center, use of these boundary control arrangements of this invention provide a reduction in the deposition rate at the edge of the wafer so that the overall deposition rate across the wafer can be made more uniform.

The degree of surface projection in the region 52B is exaggerated in FIG. 7 or purposes of illustration. Furthermore, it should be understood that the schematic illustration in FIG. 7 is for purposes of a simplified explanation of the features of this invention. The specific utilization of these features in a particular embodiment of this invention will be discussed later. The localized induction heating control feature of this invention and the localized boundary control feature of this invention can be used separately and together in improving the performance of an induction type reactor system. Furthermore, these features cooperate with the provision of the infrared reflecting surface 55 to enable a high performance induction heating type of CVD reactor system to be implemented.

As part of this invention, in combination with the features described above, an infrared reflecting coating is placed on one wall surface of the reaction chamber wall 51. This infrared reflecting coating will reflect infrared (heat) radiation from the susceptor 52 and the wafer 54 back to the susceptor and wafer. In the embodiment of FIG. 7, a reflecting coating 55 is formed on exterior wall surfaces of chamber wall 51. In the embodiment of FIG. 8, a reflecting coating 58 is formed on interior wall surfaces of chamber wall 51.

Since the susceptor 52 is heated by induction from the induction coil 56, the walls 51 of the reaction chamber may be cooled by a flow of cooling water or other heat transfer liquid. This cooling water flow may be provided through a channel 57 formed adjacent the outer wall surface of the chamber wall 51. Such a cooling water channel may be formed by a separate chamber disposed concentrically over the reaction chamber 51. The walls of the separate chamber must also be formed of a dielectric material so that induction heating of those walls is not produced by the induction coil 56.

Consideration of the thermal aspects of the system shown in FIG. 7 shows that, in a properly designed system, a substantial percentage of the energy radiated from the front surface of the susceptor 52 and the wafers 54 thereon will be reflected from coating 55 back to the susceptor and the wafers. This minimizes radiant heat loss from the front side of the wafers and thus reduces the thermal gradient from front to back thereof. In addition, during the temperature ramp-up portion of the cycle, the reflection of heat energy from the hotter susceptor back to the front wafer surface provides beneficial front surface heating of the wafer. The susceptor 52 is heated by an induced current in the graphite substrate to a temperature typically in the range of 1000° to 1200° C. This represents almost 1500° Kelvin. At this temperature the graphite susceptor radiates infrared radiation at wavelengths between about 0.5 micron and five microns with the highest intensity of radiation being in the 1-3 micron range. About seventy-five percent of the infrared energy radiated is in the 0.5 micron to 4 micron band.

In this embodiment the wall 51 of the reactor must be formed from a material such as quartz which is highly transparent to the infrared radiation emitted by the susceptor and wafer so that a high percentage of this heat energy will pass through the wall on both the original and return pass. Based on the absorbance value of quartz, an average of about 90% of the energy radiated by the susceptor in the 0.5-4 micron band will be transmitted through the quartz layer 51 and strike the reflecting coating 55. Coating 55 is preferably formed to have a high reflectance value for infrared radiation in that band. A number of suitable metal layers could be employed as the infrared reflecting coating in this invention. For example a plated gold layer will reflect about 97% of all energy in the 0.5 to 4 micron band. Other metals such as silver, aluminum and copper could also be utilized and will have a very high reflectivity for infrared radiation in this wavelength range.

Since about 75% of the radiated infrared energy emanating from the susceptor is transmitted through the quartz wall 51 with about 90% efficiency, then reflected with about 97% efficiency and then retransmitted through the quartz wall with about 90% efficiency, more than 50% of the energy radiated from the susceptor and wafers will arrive back at the radiating surfaces. This reduces substantially the front side wafer heat loss and reduces the temperature gradient between the front and back side of the wafer. The net result is less wafer bowing due to thermal gradients which, in turn, results in a lower radial temperature gradient. It has been discovered that this substantial reduction in front side wafer heat loss and associated uniformity of wafer heating contributed by other features of this invention enables a reactor system in accordance with this invention to process wafers at temperatures up to about 1200° C. without any substantial crystallographic slip over major portions of the semiconductor wafer.

As shown in FIGS. 7 and 8, when the susceptor 52 is orientated in a vertical direction, the wafers 54 are preferably held within a recess 53 in the susceptor. Since some semiconductor wafers may have a slight concave bow, it is preferable to have the bottom surface of the recess 53 slightly concave so that the central region of a bowed wafer will not contact the susceptor and leave certain peripheral edge regions out of contact with the susceptor. Preferably the depth of the concave recess at the center is about 0.004 inches. This accommodates the maximum allowable initial bowing of the wafer which is about 0.002 inches and permits some further, thermally induced bow in the wafer to occur before a central region of the wafer will contact the surface of the susceptor in that region.

The infrared reflecting coating 55 on the quartz wall 51 of the FIG. 7 embodiment may be formed from a number of materials as noted above, and these materials may be applied in a variety of known ways, such as by plating, vacuum evaporation and the like. It should also be understood that any type of infrared reflecting coating design may be utilized, including multiple layer optical coatings which are designed to have high reflection in the near infrared over a relatively broad band of wavelengths. Because of the large surface area to cover, it is convenient in most cases to form metal layer 55 on the quartz wall 51 using a plating process. The metal layer is formed to a thickness sufficient to make it a continuous metal layer which has high infrared reflectivity. For example, a gold layer about 0.5 micron thick may be utilized as a satisfactory reflective coating.

In FIG. 8, the infrared reflecting coating 58 placed directly on the interior surface of the chamber wall 51 has the advantage of eliminating the passage of radiation back and forth through the chamber wall 51 with accompanying absorption therein. However, use of a reflecting coating 58 on the interior surface of the chamber wall 51 requires that the materials and/or structure of the reflecting coating 58 be such as to preclude any contamination of the silicon wafers 54 during operation of the reactor. While gold would be an efficient reflector on the interior wall surface, it cannot be used since it could be transferred to the wafer via vapor phase transfer and result in severe wafer contamination. Single layers of other noble metals such as platinum, palladium, rhodium or iridium may be employed since they have a very low chemical activity and minimal contamination effect on silicon wafers. Films of reasonably good reflectivity in the infrared can be formed from these metals.

It is also possible to use a layer of silicon as a suitable reflector layer 58 on the interior wall surface. A high purity silicon coating would not contaminate the deposited epitaxial film. Furthermore, if the silicon layer is kept cold enough by external wall cooling it will not react with the hydrochloric acid vapors which are by-products of the deposition and it will not be etched by the hydrochloric acid during the wafer etch stage of the epitaxial silicon deposition process. A pure silicon film will have an average reflectivity greater than thirty percent over the wavelengths of infrared radiation radiated by the susceptor and wafer and thus produce the same effect of reducing the heat loss from the front surface of the wafer.

One approach to providing an internal reflecting coating 58 in the FIG. 8 embodiment is to first form a metal reflecting layer on the interior wall surface, followed by coating the metal reflecting layer with a stable, non-contaminating dielectric layer such as silicon dioxide. In addition, the internally coated chamber wall can be readily cleaned by dilute acids which will not attack the silicon dioxide layer.

A preferred embodiment of an internal reflecting coating comprises a multilayer coating employing alternate layers of silicon and silicon dioxide. For example, a multilayer coating using six layers (three silicon and three silicon dioxide) may be used. Each of the layers may be about 0.5 microns thick. The average reflectivity of such a coating is about sixty percent in the wavelength region between 0.6 and 2.6 microns.

In providing an infrared reflective coating on the interior surface of the reactor, it is preferable to tailor the degree of reflectance and absorption of infrared energy such that some absorption of energy into the chamber walls will be maintained, and thus effective cool down of the chamber and susceptor after completion of the epitaxial deposition process can be achieved. If the degree of reflectivity of the coating 58 is too high, an undesirable length of time would be required to lower the temperature of the susceptor and wafers after the deposition process is completed so that the susceptor may be removed from the chamber and the wafers unloaded and replaced for the next deposition cycle. Various approaches may be taken to tailoring the reflectivity of the coating to achieve this end result. For example, in the multiple layer silicon-silicon dioxide coating, the thickness of the individual layers may be adjusted to vary the reflectivity of the coating.

It is an important feature of this invention that water cooling of the walls of the reaction chamber is employed to maintain the interior wall temperature below a value at which substantial deposits of silicon will form thereon and become a potential source of contamination in subsequent process runs. Such water cooling is required due to the absorption of substantial amounts of IR radiation emitted from the susceptor and wafers in the quartz wall and/or coatings formed thereon to reflect energy. The interior walls of the chamber are maintained at a temperature in the range of about 300°–700° C. and preferably in the range of 400°–600° C. Temperatures below 300° C. should be avoided to preclude condensing of oils and other potentially contaminating substances on the interior walls of the chamber.

The degree of cooling required to achieve this temperature range for the reactor wall is attainable with liquid cooling but would not be reliably attainable with air cooling. Liquid cooling has an associated heat transfer coefficient of about 50 BTU/(hr. ft$^2$° F.) as contrasted to the coefficient value of 5 for air cooling. The principles of this invention may be employed in the induction heated reactor systems shown in FIGS. 4 and 6 to improve the thermal performance of those systems. They are more advantageously and thus preferably used in an induction heated cylindrical reactor system that has expanded wafer handling capabilities. Such preferred embodiments will be described below.

The theory and practice of chemical vapor deposition as applied to forming layers on a semiconductor substrate involve relatively complex but well-known principles which need not be described here. A general introduction and discussion of chemical vapor deposition and silicon epitaxy are set forth in an article by Dr. Martin L. Hammond in the November 1978 issue of *Solid State Technology* and entitled "Silicon Epitaxy" and an article entitled "Introduction to Chemical Vapor Deposition" in the December 1979 issue of *Solid State Technology*. These articles are hereby incorporated by reference for their discussion of the physical and chemical processes performed in a chemical vapor deposition system in accordance with this invention.

Figure 9:
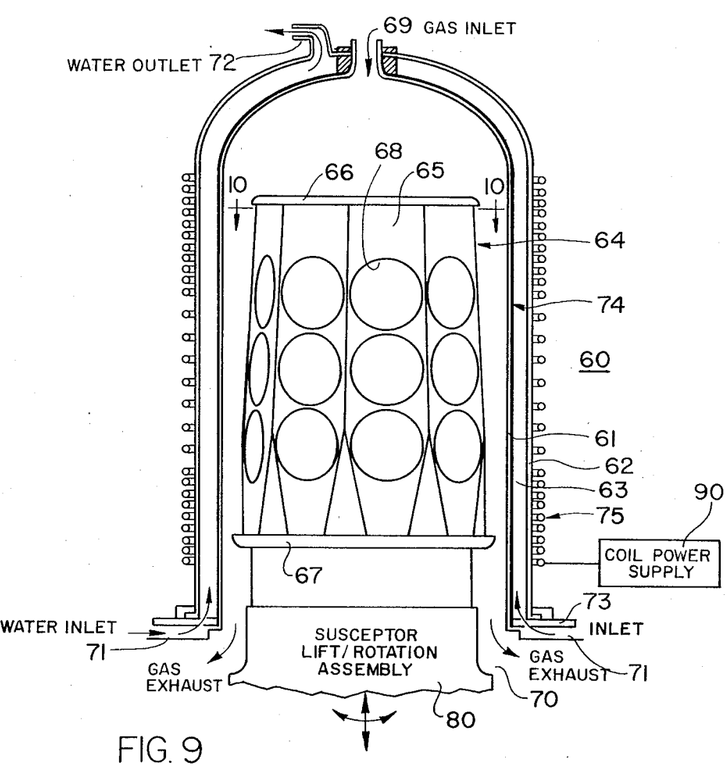
FIG. 9 is a partly sectioned elevational view of an induction heated cylindrical reactor system in accordance with this invention.

FIG. 9, along with FIGS. 10–14, illustrate the use of the reactor system structure of this invention in a preferred embodiment comprising a cylindrical reactor system 60. The reactor system 60 includes an inner quartz bell jar 61 and an outer dielectric bell jar defining a water cooling channel 63 therebetween. A cooling water inlet 71 and a cooling water outlet 72 are provided for bringing the cooling water into the channel 63 and withdrawing the heated water from the channel 63. A generally cylindrical susceptor 64, preferably formed from high purity graphite coated with silicon carbide, is supported on a susceptor lift and rotation assembly 80 which is adapted to rotate the susceptor 64 during processing of semiconductor wafers in the system. The susceptor lift/rotation assembly 80 also is adapted to move the susceptor arrangement 64 in and out of the inner quartz bell jar 61 for loading and unloading of the wafers from the wafer holding recesses 68 in the susceptor.

The exterior wall surface of the inner quartz bell jar 61 has the infrared reflecting coating 74 formed thereon. This layer is represented by the thicker black line at the outer wall surface of the quartz bell jar 61. (It should be understood that the interior wall reflecting coating system of FIG. 8 could also be used.) The induction coil arrangement 75 surrounds the outer bell jar 62. As shown, the pitch of the individual coil elements may be varied from top to bottom of the overall coil to control the relative amount of energy that is coupled into the susceptor at various vertical locations. As shown in FIG. 9, it is generally desirable to couple more energy into the top and bottom portions of the susceptor in order to create a flat temperature zone across a broad central portion of the susceptor where the individual semiconductor wafers are mounted. It is also important to have a substantially flat horizontal temperature profile across the individual faces 65 of the susceptor.

During chemical vapor deposition, the chemicals in gas form are brought into the interior of the inner bell jar 61 through a gas inlet 69. The gases flow down the sides of the cylindrical susceptor arrangement 64 and are exhausted out the bottom through the gas exhaust ports 70.

Figure 10:
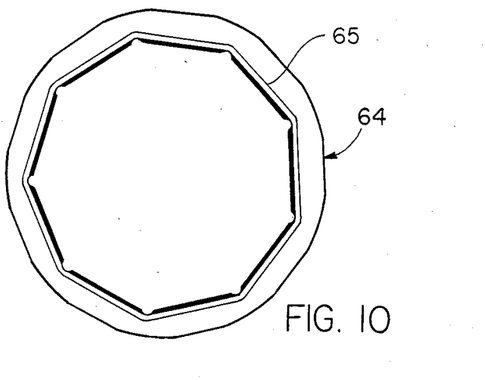
FIG. 10 is a top plan view of a preferred susceptor structure in accordance with this invention taken along the lines 10—10 in FIG. 9.
Figure 11:
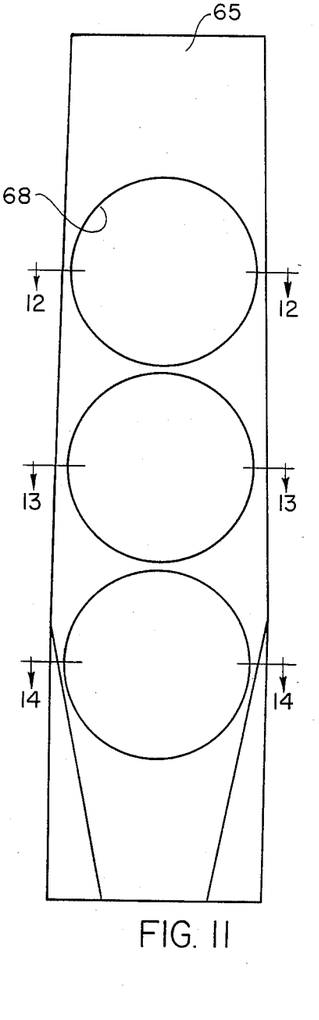
FIG. 11 is an elevational view of one sidewall panel of a susceptor structure in accordance with this invention.

As shown particularly in FIGS. 9 and 10, susceptor arrangement 64 has a plurality of flat sidewall portions 65, each of which has three wafer holding recesses 68 therein. The susceptor assembly 64 also includes a susceptor cover 66 and a susceptor base 67. In the particular embodiment shown, there are nine sidewall portions 65 so that the entire susceptor holds twenty-seven wafers. The particular susceptor design shown in FIGS. 9 and 10 and the entire reactor assembly shown in FIG. 9 is designed for five inch semiconductor wafers. It should be understood that this invention can be utilized in systems of the general type depicted in FIGS. 9 and 10 with other susceptor configurations for larger or smaller sized wafers, i.e. susceptors with greater or fewer number of sidewall faces and greater or fewer wafers holding recesses on each sidewall face.

The individual wafer holding recesses 68 are formed to an average depth of about 0.04 inches so that a wafer having a thickness of about 0.02 inches has its front surface recessed a short distance inside the front face of the individual sidewalls 65. It should also be noted that the individual sidewalls 65 are oriented at a slight angle to the vertical. This angle has a functional purpose from the standpoint of the gas flow and chemical reaction being carried out in the system. It also helps to maintain the wafers in place as the susceptor is rotated at about four RPM during the deposition process. This rotation speed is not critical and the system can conveniently use a speed in the range of 1-10 RPM. This embodiment of the invention does not employ the gas-susceptor boundary control feature which is discussed below in conjunction with FIGS. 15-23.

Figure 12:
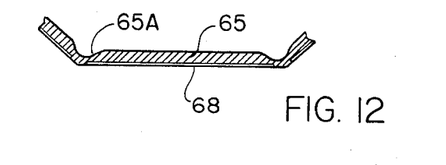
FIG. 12 is a partial section view of a susceptor wall design in accordance with this invention taken along the lines 12—12 in FIG. 11.
Figure 13:
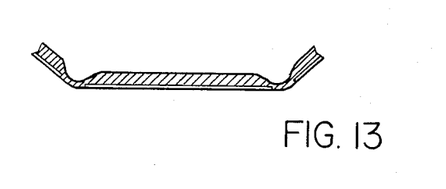
FIG. 13 is a section view of a susceptor wall design in accordance with this invention taken along the lines 13—13 in FIG. 11.
Figure 14:
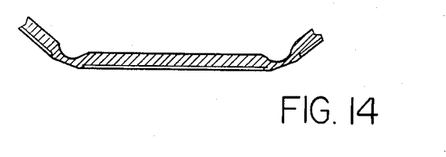
FIG. 14 is a section view of a susceptor wall design in accordance with this invention taken along the lines 14—14 in FIG. 11.

FIGS. 12-14 illustrate the cross-sectional profile of each individual susceptor sidewall 65. Each of the sidewall portion cross-sections shown in FIGS. 12-14 has a U-shaped groove 65A formed in the corner region where the adjacent susceptor sidewalls 65 meet. This generally U-shaped groove with a rounded bottom produces a substantial thinning of the susceptor sidewall in the corner regions. In accordance with this invention, the frequency of the alternating current energy applied to the induction coil 74 by the power supply 90 is preferably maintained in the range of about one to fifteen khz. A frequency of 10 khz is a convenient value to use. The purpose of maintaining the induction frequency within the 1-15 khz range is to produce induced currents in the walls of the susceptor 64 which have a substantial skin depth and preferably a skin depth greater than the wall thickness of the susceptor. The susceptor sidewall portions 65 may each have a thickness of 0.25 inches at the top and bottom portions of the susceptor with a somewhat greater wall thickness of about 0.375 inches in the central portion of the susceptor occupied by the wafer holding recesses 68. The skin depth of the induced current in the frequency ranges set forth above is in the range of 0.75 to 0.25 inches.

The purpose of having a relatively large skin depth for the induced current is to permit control of the local thermal energy generated within the susceptor using the grooves 65A. The combination of the relatively large skin depth of the induced current in the susceptor and the thinning of the susceptor walls in the regions of the groove 65A produces a greater heating of the susceptor material in the thinner wall regions. This greater heating of these regions of the susceptor produces a more uniform horizontal temperature profile across the faces of the sidewalls 65. The preferred thickness of the groove corner region 65A is readily determined by experimenting with several iterations of the thickness value. In general the finally determined value will depend on the susceptor configuration, but will usually be close to the value of the thickness of the top and bottom portions of the susceptor.

A prototype version of the cylindrical induction heated reactor illustrated in FIG. 8 has been operated with wafer temperatures up to about 1200° C. with virtually slip-free performance. This result is made possible by the combination of reduced front side heat loss from the wafers due to reflection of radiated energy back to the susceptor and wafers and the uniform horizontal and vertical temperature profile in the regions of susceptor occupied by the wafers. In addition the wafer starting material available today has increased strength due to the fact that there are less intrinsic defects in the wafers and due to the introduction of controlled amounts of oxygen into the lattice structure so the wafer can withstand higher thermal stresses before slipping on the crystal planes. A by-product of the improved thermal performance of the system of this invention is a reduction in power required to achieve a certain internal system temperature. Data taken on an experimental prototype version of the invention shows that the electrical power required to achieve a temperature of 1187° C. with no reflective coating was about 70 kilowatts. With a reflective coating of gold on external reactor wall surfaces, the power required dropped to about 50 kilowatts. This illustrates the effectiveness of the reflective coating in reducing heat loss from the front surfaces of the susceptor and wafers.

Figures 15, 16, 17, 18:
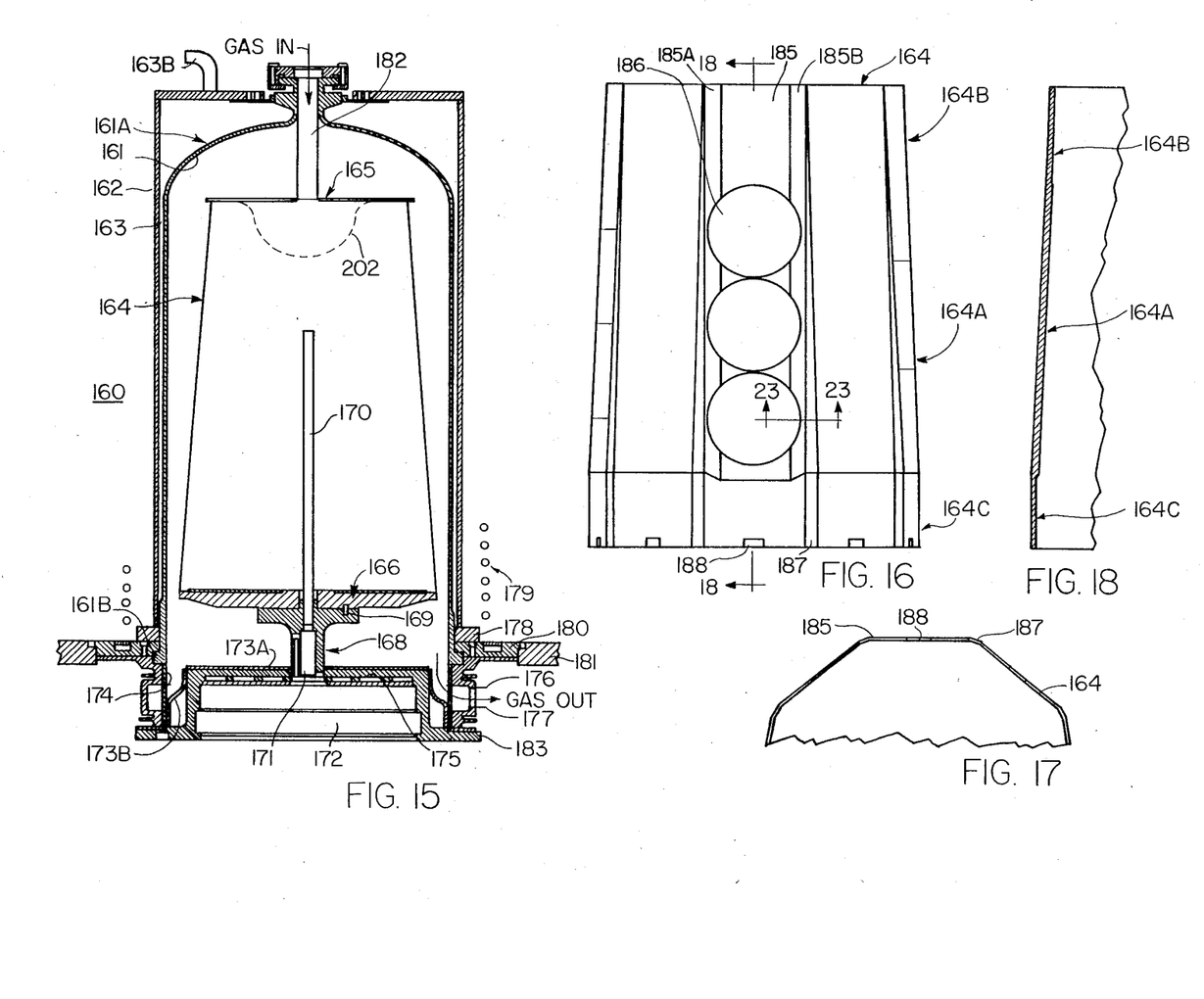
FIG. 15 is a sectioned elevational view of the major components of a induction heated cylindrical reaction system in accordance with another embodiment of this invention.
FIGS. 16 and 17 are side and bottom views respectively of a susceptor incorporating features of this invention.
FIG. 18 is a partial section view of the susceptor FIG. 16 taken along the lines 18—18.

FIG. 15 depicts, in cross section, chemical vapor deposition system 160 which comprises another alternative embodiment of this invention. CVD system 160 includes a quartz bell jar 161 which forms an enclosed reaction chamber. A water jacket enclosure 162 surrounds bell jar 161 and forms a water coolant channel 163 therebetween. Coolant water is brought into the coolant channel 163 at the bottom of the coolant channel and exits through outlet 163B on the top of the coolant chamber 162.

A susceptor 64, shown only in outline in FIG. 15, is mounted on a spider type mounting arrangement 166. Spider mounting arrangement 166 is in turn mounted on a quartz pedestal 168. Quartz pedestal 168 is rotatably mounted to a seal plate arrangement 183 and includes an internal shaftway 171 which receives a rotating drive shaft from a drive mechanism (not shown) which is mounted within the hollow region 172. The seal plate assembly 183 is preferably made from stainless steel and has a pair of quartz shields 173 and 174 which protect it from coming into contact with the corrosive reactive gases. Exhaust ring 176 is internally lined with a quartz exhaust sleeve 174 which has an arrangement of circumferential apertures which permit reactive gas to escape into the exhaust ring 176 and out through exhaust port 177.

The bottom flange 161B of bell jar 161 is mounted in sealed fashion between the exhaust ring 176 and a table insert 180. The water jacket 162 is mounted on a water jacket flange 178 which is carried on the table top insert 180. Table top insert 180 is a ring shaped member which mounts into a circular opening in table top 181.

The seal plate assembly 183 is carried on an elevator mechanism (not shown) which permits seal plate assembly 183, quartz pedestal 168 and spider mounting arrangement 166 to be lowered along with the susceptor 164 out of the reaction chamber.

Induction coil 179 surrounds the water jacket 162 and generally has the same configuration as the induction coil shown in FIG. 9. Preferably the pitch of the induction coil turns is smaller in locations near the top and bottom of the susceptor as shown in FIG. 9. During operation of the CVD reactor 160, reactant gases are communicated into the reaction chamber by way of a quartz inlet tube 182 which extends at least to the top plate 165 on susceptor 164. The reactant gases enter a preheating and mixing bowl 202 and then flow over the top cap 165 and down the side walls of the susceptor 164 until they are exhaused at the gas outlet 177. During the deposition cycle, the susceptor 164 is rotated, first in one direction and then the other on the spider mounting arrangement 166.

After the deposition cycle has been completed, cooling hydrogen is communicated through the quartz purge tube 170 which extends from the quartz pedestal 168 into the interior of the susceptor 164. A cooling hydrogen gas is also brought in through the gas inlet to cool the wafers and outside wall of the susceptor. Appropriate gas channels are provided for communicating the cooling hydrogen into the quartz purge tube 170.

The outer surface of the quartz bell jar 161 has a metal reflector layer 161A formed thereon for the purposes disussed above.

Referring now to FIGS. 16-18 and FIG. 23, the configuration of susceptor 164 will be discussed. Susceptor 164 is a hollow graphite body which has the general configuration of a truncated pyramid and includes a central wafer carrying section 164A, and top and bottom end sections 164B and 164C. The outer walls of the bottom end section 164C have vertical side walls to reduce the overall diameter of the susceptor at the bottom and thereby save space in the reaction chamber. The wafer carrying section 164A and the top section 164B have slight inwardly tapering walls.

As shown in FIG. 18, the central wafer carrying section 164A has thicker walls than the top and bottom end sections 164B and 164C. The thicknesses are exaggerated in FIG. 18 relative to the height for illustration purposes. For example the wafer carrying section 164A may have a thickness of about 0.30 inches and the top and bottom sections 164B and 164C may have a thickness of about 0.20 inches. These thickness dimensions are not critical and other values could be used.

Figure 23:
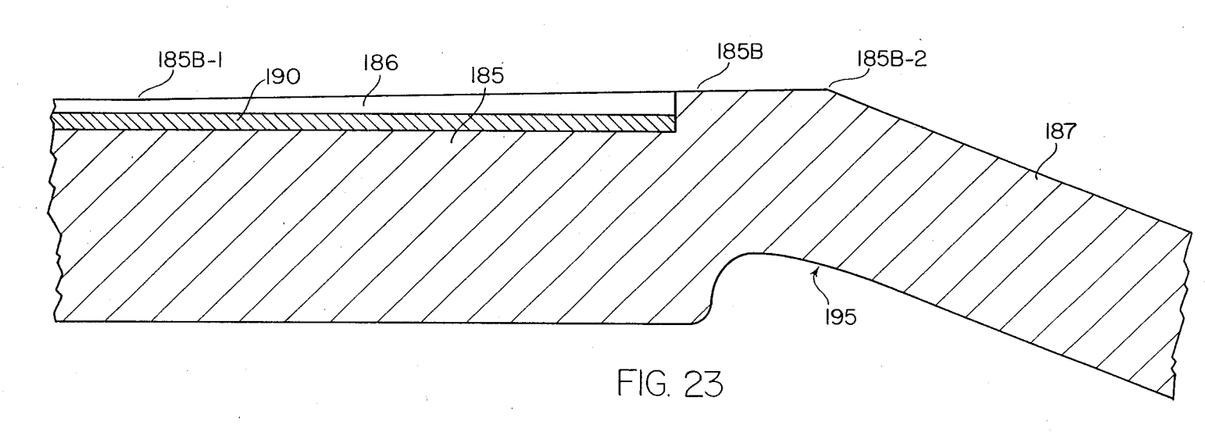
FIG. 23 is a fragmented section view through a portion of the susceptor depicted in FIG. 16 and taken along the lines 23—23 in FIG. 16.

As shown in FIG. 16, each of the wafer carrying wall segments 185 includes edge regions 185A and 185B which are contoured as shown in enlarged detail in FIG. 23. The eight other sidewall segments on the susceptor have the same configuration. The tapered corner regions 187 permit each of the sidewall segments 185 to have a constant width from top to bottom of the susceptor. This is important for uniformity of deposition. The edge regions 185A and 185B comprise a portion of a boundary control arrangement which alters the boundary condition between the reactant gases and surfaces of the susceptor relative to the wafer carrying recesses 186. The purpose of this will be described below. As shown in FIG. 23, each of the tapered corner regions 187 has a reduced wall thickness which may for example be about 0.180 inches in thickness. The width of this reduced thickness edge region tapers to a narrower wall region from bottom to top of the susceptor.

Figure 19:
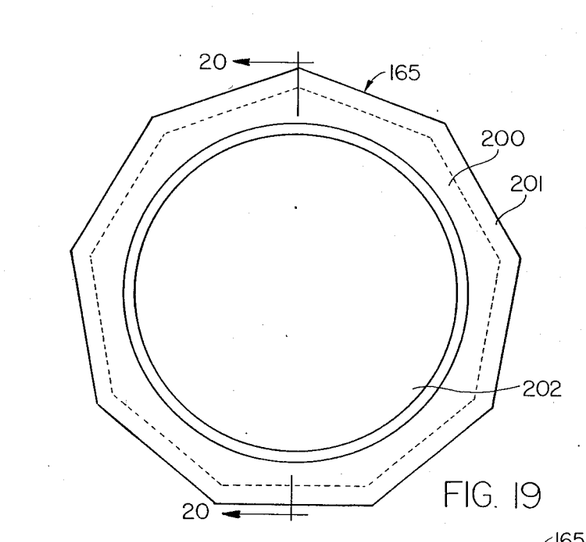
FIG. 19 is a top view of a susceptor top cap employing the features of this invention.
Figure 20:
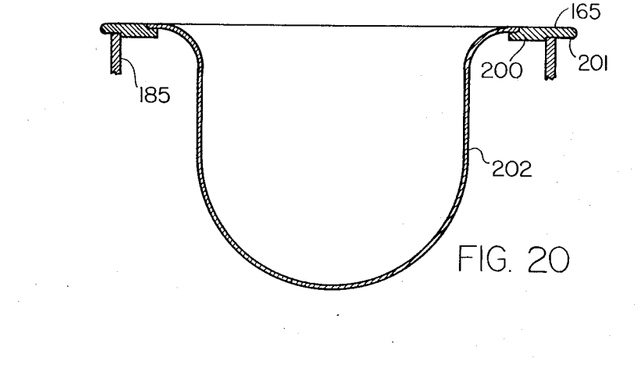
FIG. 20 is a sectioned view of the top cap of FIG. 19 taken along the lines 20—20.

FIGS. 19 and 20 show the susceptor top cap 165 and the preheating and mixing bowl 202 mounted thereto. The top cap 165 has a overall outline similar to the outline of the side walls of the susceptor and has a top wall region 200 which rests over the open top of the susceptor 164 with an overhanging region 201 as shown in FIG. 20. Other configurations of the top cap outline, such as a scalloped edge outline could also be used. Overhanging wall portion 201 also serves as part of a boundary control arrangement which alters the boundary conditions between reactant gases and surfaces of the susceptor and wafers to assist in providing more uniform deposition. This function will be described in more detail below.

Figure 21:
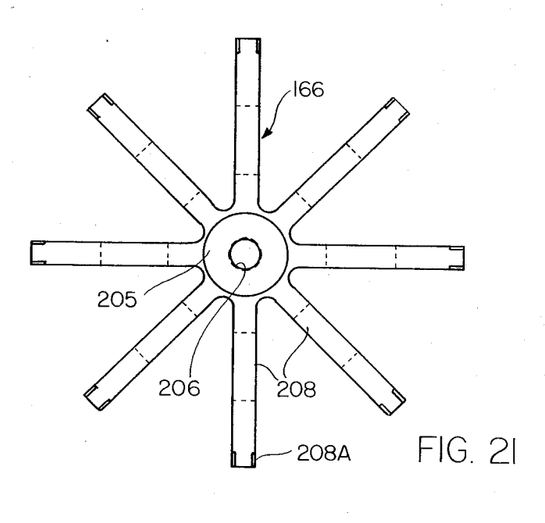
FIG. 21 is a top view of a susceptor mounting arrangement utilized as a portion of this invention.
Figure 22:
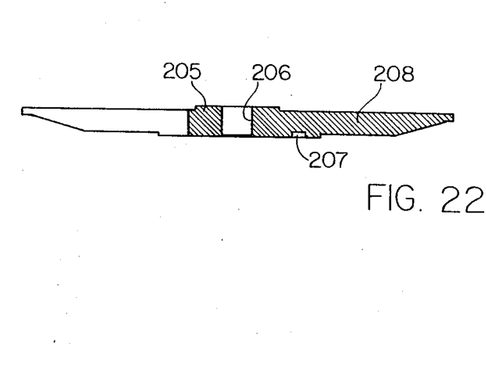
FIG. 22 is a partial section view of the mounting arrangement depicted in FIG. 21.

FIGS. 21 and 22 depict the general structural characteristics of the spider support arrangement 166. A central hub 205 has a central aperture 206 therein which fits over a projection on the quartz pedestal 168 depicted in FIG. 15. The keyway 207 cooperates with a key on the quartz pedestal shown in FIG. 15 as key 169. This locks the spider and quartz pedestal together for common rotation.

Figure 24:
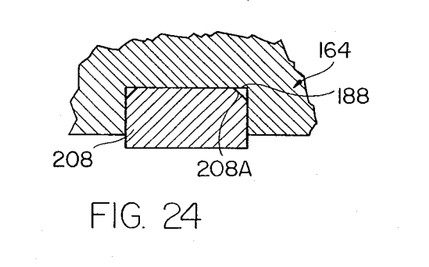
FIG. 24 is an enlarged section view showing the susceptor mounting arrangement.

Radiating out from the central hub 205 are plurality of support legs 208. The arrangement of support legs 208 in FIG. 21 shows eight support legs simply as a drawing convenience. Obviously nine support legs extending outward at equally displaced radial positions would be required to support the nine-sided susceptor depicted in FIGS. 16 and 17. As shown in enlarged view in FIG. 24, each of these support legs 208 has a chamfered top edge 208A. Each of the susceptor side wall elements 185 has a slot 188 formed in the bottom edge to fit over the corresponding support leg 208 of the spider mounting arrangement 166. Using this mounting arrangement, the susceptor 164 will be carried on the spider support arrangement 166 in a registered position with the central axis of the susceptor coincident with the central axis of the support spider. In addition, during heating of the susceptor, which causes it to expand radially outward, the alignment of the center axis of the susceptor and the mounting spider arrangement will be maintained as the susceptor side walls are free to move outwardly on the support legs 208.

An experimental prototype version of the CVD reactor system 160 depicted in FIGS. 15-24 has been operated to achieve virtually slip free performance with about one percent uniformity of deposition across each wafer and from wafer to wafer in a deposition cycle. Each of the features of this invention contributes substantially to achieving this level of performance of the system.

Consider first the susceptor thickness contouring feature of this invention which permits control over the degree of induced heating at prearranged susceptor locations and this alters the temperature of the susceptor and the temperature distribution within regions of the susceptor. The reduced thickness top and bottom sections 164B and 164C (FIG. 18) provide a greater degree of induction heating at these regions of the susceptor which are susceptible to greater loss. This contributes substantially to maintaining uniformity of temperature from top to bottom across the wafer carrying section 164A of the susceptor. The reduced thickness corner regions 187 cause greater induction heating at these locations. This assists in maintaining a uniform temperature profile horizontally across the side wall segments of the susceptor and thus provides more uniformity of wafer heating.

The gas-susceptor boundary control arrangements are also extremely important to achieving the degree of uniformity of deposition described above. The overhanging edge of the top cap 165 provides one aspect of the boundary control arrangement. This projecting surface alters the gas flow in a beneficial manner across the top row of wafers and reduces the deposition rate thereat to equalize it with the deposition rate at the lower rows of wafers carried on the susceptor. It should be appreciated that, instead of providing an overhanging top cap, various other approaches to providing a surface projection on the susceptor to alter the gas-susceptor surface boundary could be provided to achieve substantially the same result. For example, it should be possible to contour the susceptor itself to provide gas-susceptor surface boundary conditions which will give a similar result.

The contoured surfaces 185A and 185B at the edges of the susceptor side wall segments provide a second aspect of the boundary control arrangement. These contoured side regions of the susceptor side walls displace the wafer surface adjacent those regions further away from the susceptor surface and this reduces the deposition rate on edge regions of the wafers. Without such boundary control, the deposition tends to be substantially heavier on the side regions of the wafer compared to the central regions.

Contouring of the edge regions of the susceptor sidewalls could be accomplished by applying separate material to those regions of the susceptor, but the preferred approach is simply to contour the wall material of the susceptor itself to achieve the contoured outwardly projecting surface. Only a very slight change in the height of the projecting region 185B from one edge 185B-1 shown in FIG. 23 to the other edge 185B-2 is required to alter the deposition rate at the side regions of the wafer 190. The wafer accepting recess 186 may have a depth in the central region of about 0.040 inches with a slight concave rounding of the bottom surface as described above. The maximum thickness of the projecting region 185B may vary from 0.030 to 0.040 depending on wafer size. The actual best dimensions can readily be determined by several iterations of experimentation to determine which dimensions produce the best uniformity of deposition on the wafers.

The spider type of mounting arrangement is also important to achieving uniformity of deposition since it precludes a shift of position of the susceptor with respect to the central axis of the reaction chamber during the heating cycle of the susceptor. Any such shift can alter the uniformity of deposition even though the susceptor is rotated in sequential opposite direction cycles throughout the overall deposition cycle.

By enabling an induction heating reactor system to be successfully employed in semiconductor processing of epitaxial silicon layers, the system of this invention will promote higher wafer throughput with larger semiconductor wafers in accordance with prevailing semiconductor industry trends. Accordingly, the system of this invention makes it possible to realize in practice the advantages of an induction heated reactor system including substantially lower energy requirements and substantially lower maintenance. The system of this invention will produce fewer contamination problems since the sidewalls of the interior bell jar are cooled by the water or other cooling liquid to a temperature substantially below the value at which substantial silicon wall deposits will form. The simplicity and reliability of the system in accordance with this invention together with the ease of scaling up the system to even larger wafer sizes and/or greater wafer loads will encourage expanded use of silicon epitaxy for improving IC device performance in a number of semiconductor process technologies in addition to bipolar device processing.

It should be understood that the liquid cooling of the reactor bell jar could be accomplished by means other than a liquid channel. For example, a liquid cooling fluid coil could be wrapped around the chamber to accomplish a similar function. Alternatively, a cooling fluid could simply be supplied to the neck of the chamber and permitted to flow down over the exterior surface to a collecting trough at the bottom.

While various embodiments of this invention have been described above, it should be understood that modifications could be made by persons of skill in the art without departing from the scope of the invention as claimed in the following claims.

What is claimed is:

1. In a chemical vapor deposition system, in combination:
   a generally closed reaction chamber having walls formed from a dielectric material;
   a susceptor for carrying a plurality of semiconductor wafers, said susceptor being adapted to be positioned within said chamber and being formed from an electrically conductive material adapted to be heated by induction;
   an induction coil positioned in the vicinity of said susceptor for carrying an alternating electric current to produce induction heating of said susceptor and thereby heating said wafers thereon;
   means supplying said induction coil with alternating electric current at a prearranged frequency to induce heating currents throughout a region of said susceptor having a skin depth directly related to said prearranged frequency;
   said susceptor being formed to have a general thickness less than or equal to said skin depth, and having regions of substantially reduced thickness at prearranged locations relative to wafer positions on said susceptor to produce greater induced heating at said prearranged locations and thereby to alter the temperature of said susceptor at said regions.

2. The system of claim 1, wherein said susceptor has predefined wafer positions thereon, and said regions of substantially reduced thickness of said susceptor are positioned at locations which produce a substantially uniform temperature profile across said susceptor at said predefined wafer positions.

3. The system of claim 2, further comprising reflector means facing said susceptor and wafers carried thereon for reflecting heat energy radiated from said susceptor and said wafers back to said susceptor and said wafers to reduce substantially the heat loss therefrom and thereby to reduce substantially the thermal gradient front front to back surfaces of said wafers; the combination of said uniform temperature profile of said susceptor at said predefined wafer positions and said reduced thermal gradient in said wafers providing substantially slip-free heating conditions for said wafers and substantially uniform deposition rates on said wafers during a deposition process carried out in said system.

4. The system of claim 3, wherein said dielectric material of said reactor chamber walls is substantially transparent to infrared radiation, and said reflector means comprises a heat reflecting coating formed on exterior surfaces of said wall portions of said chamber.

5. The system of claim 3, wherein said reflector means comprises a heat reflecting coating formed on interior surfaces of said wall portions of said chamber.

6. The system of claim 5, wherein said heat reflecting coating comprises a layer of heat reflecting material formed on said interior surfaces and a thin layer of transparent dielectric material formed over said layer of heat reflecting material.

7. The system of claim 3, further comprising a wall cooling system arrangement for said closed reaction chamber comprising a second generally closed chamber surrounding said reaction chamber, the interior wall surface of said second chamber being spaced a moderate distance from the exterior wall surface of said first chamber to form a channel therebetween, and means for pumping a cooling liquid through said channel to cool the walls of said reaction chamber.

8. The system of claim 1, wherein said closed reaction chamber comprises a generally cylindrical chamber disposed with its central axis in a vertical orientation; and susceptor comprises a hollow generally cylindrical body adapted to be positioned within said cylindrical chamber with its central axis disposed in a vertical orientation; said induction coil comprising a generally cylindrical coil having an inner diameter greater than the outer diameter of said chamber and being disposed around portions of said chamber confining said susceptor; said susceptor body having an arrangement of straight side wall segments including a regular array of wafer carrying recesses formed on front surface regions thereof; said straight side wall segments meeting at corner regions and each of said corner regions including one of said regions of substantially reduced wall thickness; said reduced wall thickness at said corner regions producing a more uniform horizontal temperature profile across said side wall segments and thereby producing a more uniform temperature profile across semiconductor wafers supported thereon.

9. The system of claim 8, wherein said susceptor body comprises a central wafer carrying wall region and upper and lower wall regions of substantial length which dispose the upper and lower extremities of said central wafer carrying wall region a substantial distance from the top and bottom ends of said susceptor, said upper and lower wall regions having a wall thickness substantially less than said central wall region to produce substantially greater induction heating of said upper and lower wall regions and thereby to provide a more uniform temperature profile from top to bottom of said susceptor.

10. A system of claim 8, wherein said prearranged frequency of an alternating electric current is in the range of about 5 to 15 kilohertz and the maximum thickness of said susceptor is maintained at less than about 0.50 inches.

11. In a chemical vapor deposition system, in combination:
a generally cylindrical reaction chamber having walls formed from a dielectric material and being disposed with its central axis in a vertical orientation;

a susceptor formed from an electrically conductive material adapted to be heated by induction, said susceptor comprising a hollow body having a generally truncated pyramidal configuration and adapted to be positioned within said reaction chamber with its central axis disposed in a vertical orientation, said body having an arrangement of substantially straight side wall segments meeting at corner regions and including an array of wafer carrying recesses formed on front surface regions thereof in multiple rows such that said wafers face the cylindrical side walls of said reaction chamber;

a heating system for heating said susceptor by induction and comprising a coil having a generally cylindrical configuration disposed over said second chamber and having a height greater than the height of said susceptor, and power supply means for supplying an alternating current to said coil for induction heating of said susceptor;

gas delivery means for delivering reactant gases to said reaction chamber in a region above said susceptor and for withdrawing reactant gases from said reaction chamber below said susceptor; and boundary control means carried on said susceptor at prearranged locations relative to said wafer carrying recesses to locally alter the boundary conditions between said reactant gases and the surfaces of said susceptor and wafers carried thereon and thereby to provide more uniform deposition of material on said wafers.

12. The system of claim 11, wherein said boundary control means include means defining a wall surface region projecting radially outward from said susceptor at a position spaced above a top row of said wafer carrying recesses to equalize the relative deposition of material on wafers in said top row with respect to wafers in lower rows of wafer carrying recesses on said susceptor.

13. The system of claim 12, wherein said means defining said projecting wall surface region comprises a top cap carried on the top edge of said susceptor and having marginal edge regions overhanging the adjacent front wall surfaces of said susceptor.

14. The system of claim 13, wherein said top caps further includes a central portion defining a generally bowl shaped recess extending into the interior of said susceptor; and said gas delivery means includes piping means for delivering reactant gases directly into said bowl shaped recess for preheating and mixing of said reactant gases prior to passing over the overhanging edge portions of said top plate.

15. The system of claim 11, further comprising means for rotating said susceptor in sequential opposite direction cycles during a layer deposition cycle; and wherein said boundary control means includes means defining contoured wall surface regions overlapping side edges of each of said wafer carrying recesses to contour the displacement between the susceptor surface and the wafer surface at said locations and thereby to produce more uniform deposition of material from side to side on each wafer carried in said wafer carrying recesses.

16. The system of claim 15, wherein said means defining contoured wall surface regions comprises contoured outwardly projecting edge regions integrally formed on said susceptor at said regions.

17. The system of claim 11, wherein said susceptor body comprises a central wafer carrying wall region and upper and lower wall regions of substantial length which dispose upper and lower extremities of said central wafer carrying region a substantial distance from the top and bottom ends of said susceptor, said corner regions of said straight side wall segments of said susceptor and said upper and lower wall regions having a wall thickness substantially less than that of said central wall region; said alternating current supplied to said induction coil having a prearranged frequency which produces an induction current skin depth at least about equal to the wall thickness of said central wafer carrying wall region, whereby said upper and lower wall regions and said corner regions of reduced wall thickness have substantially greater induction heating, thereby providing a more uniform temperature distribution from top to bottom and side to side of said side wall segments of said central wafer carrying wall region of said susceptor.

18. The system of claim 17, further comprising a heat reflective coating carried on side reaction chamber carried thereon for reflecting heat energy radiated from said susceptor and wafers back to said susceptor and said wafers to reduce substantially the heat loss therefrom and thereby to reduce substantially the thermal gradient from front to back surfaces of said wafers; the combination of said uniform temperature distribution and said locally tuned boundary conditions providing highly uniform deposition of material on said wafers at deposition temperatures up to at least 1200° C. while eliminating any substantial slip in the semiconductor wafers.

19. The system of claim 11, wherein said susceptor is carried on a support arrangement comprising a central hub and a plurality of legs extending radially outward from said hub; each of said legs being oriented normal to an associated side wall segment of said susceptor; each of said side wall segments having a mounting slot formed at the bottom edge thereof and adapted to mount over one of said legs to position said susceptor on said spider support arrangement with alignment of the respective central axis of said susceptor and said hub, said susceptor being thereby free to expand and contract radially on said spider support arrangement due to thermal cycling during a deposition process while maintaining alignment of said central axes.

20. The system of claim 11, wherein each of said straight side wall segments of said susceptor has a uniform width from to top to bottom, and each of said corner regions comprises a wall segment which tapers inwardly from bottom to top of said susceptor; each of said side wall segments having an outwardly projecting region adjacent each of said corner regions and overlapping with said wafer carrying recesses to contour the displacement between the susceptor surface and the wafer surface at said locations and thereby to produce more uniform deposition of material from side to side on each of said wafers in said wafer carrying recesses.

21. The system of claim 20, wherein said susceptor body comprises a central wafer carrying wall region and upper and lower wall regions of substantial length which dispose upper and lower extremities of said central wafer carrying region a substantial distance from the top and bottom of said susceptor, said corner regions adjacent said side wall segments and said upper and lower wall regions having a wall thickness substantially less than that of said central wall region; said alternating current supplied to said induction coil having a prearranged frequency which produces an induction current skin depth at least about equal to the wall thickness of said central wafer carrying wall region, whereby said upper and lower wall regions and said corner regions of reduced wall thickness have substantially greater induction heating, thereby providing a more uniform temperature distribution from top to bottom and side to side across the side wall segments of said central wafer carrying wall region of said susceptor.

* * * * *